United States Patent
Cheng et al.

(10) Patent No.: US 12,352,823 B2
(45) Date of Patent: Jul. 8, 2025

(54) METHOD AND CIRCUIT FOR MONITORING POWER SUPPLY

(71) Applicant: INFSITRONIX TECHNOLOGY CORPORATION, Jhubei (TW)

(72) Inventors: Yuan-Kai Cheng, Jhubei (TW); Chun-Chiang Chen, Jhubei (TW)

(73) Assignee: Infsitronix Technology Corporation, Jhubei (TW)

( * ) Notice: Subject to any disclaimer, the term of this patent is extended or adjusted under 35 U.S.C. 154(b) by 159 days.

(21) Appl. No.: 17/951,597

(22) Filed: Sep. 23, 2022

(65) Prior Publication Data

US 2023/0168312 A1 Jun. 1, 2023

Related U.S. Application Data

(60) Provisional application No. 63/247,487, filed on Sep. 23, 2021.

(51) Int. Cl.
*G01R 31/40* (2020.01)
*G01K 7/22* (2006.01)
(Continued)

(52) U.S. Cl.
CPC ............ *G01R 31/40* (2013.01); *G01K 7/22* (2013.01); *G01R 15/04* (2013.01);
(Continued)

(58) Field of Classification Search
CPC ............ G01R 31/40; G01R 19/1659; G01R 19/16538; G01R 15/04; G01K 7/22; H02H 3/20; H02H 5/04; H02M 3/33592
See application file for complete search history.

(56) References Cited

U.S. PATENT DOCUMENTS 8,649,129 B2 * 2/2014 Huang .................... H02M 1/08
361/18
9,077,176 B2 * 7/2015 Ke ...................... H02M 3/33523
(Continued)

FOREIGN PATENT DOCUMENTS

CN 103532102 A 1/2014
CN 103546035 * 1/2014 .......... H02H 7/1213
(Continued)

OTHER PUBLICATIONS

Office Action issued to Taiwanese counterpart Application No. 111136265, issued on Jan. 10, 2023.
(Continued)

*Primary Examiner* — Jared Fureman
*Assistant Examiner* — Samantha L Faubert
(74) *Attorney, Agent, or Firm* — Rosenberg, Klein & Lee

(57) ABSTRACT

The present application provides method and circuit for monitoring a power supply, which firstly obtains an auxiliary side voltage from a switching power supply and then adopts a divided voltage circuit to obtain a divided voltage from the auxiliary side voltage, for detecting the divided voltage and a detected current flowed in the detection circuit with adopting a first detection circuit and a second detection circuit in an switch circuit to correspondingly generate a first and a second detection signals, which is corresponding to an ambient temperature and an output voltage of the power supply. Hereby, the power supply is monitored.

19 Claims, 17 Drawing Sheets

(51) Int. Cl.
  *G01R 15/04* (2006.01)
  *G01R 19/165* (2006.01)
  *H02H 3/20* (2006.01)
  *H02H 5/04* (2006.01)
  *H02M 3/335* (2006.01)

(52) U.S. Cl.
  CPC ... *G01R 19/16538* (2013.01); *G01R 19/1659* (2013.01); *H02H 3/20* (2013.01); *H02H 5/04* (2013.01); *H02M 3/33592* (2013.01)

(56) References Cited

U.S. PATENT DOCUMENTS

| | | | | |
|---|---|---|---|---|
| 9,906,138 | B2* | 2/2018 | Ke | H02M 3/33507 |
| 2011/0139960 | A1* | 6/2011 | Christensen | G01J 1/46 |
| | | | | 250/206 |

FOREIGN PATENT DOCUMENTS

| | | | | |
|---|---|---|---|---|
| CN | 103546035 | A | 1/2014 | |
| CN | 109067183 | A | 12/2018 | |
| CN | 210092865 | U | 2/2020 | |
| CN | 111490682 | * | 8/2020 | ........ H02M 3/33523 |
| CN | 111490682 | A | 8/2020 | |
| CN | 113315093 | * | 8/2021 | ........... H02H 7/1203 |
| CN | 113315093 | A | 8/2021 | |
| TW | 201543797 | A | 11/2015 | |

OTHER PUBLICATIONS

Search Report issued to Taiwanese counterpart Application No. 111136265, issued on Jan. 10, 2023.

* cited by examiner

METHOD AND CIRCUIT FOR MONITORING POWER SUPPLY

FIELD OF THE INVENTION

The present application generally relates to a method and a circuit for monitoring, and particularly to a method and a circuit for monitoring a power supply.

BACKGROUND OF THE INVENTION

A modern switching power supplying device generally includes detection circuits for detecting the output voltage thereof and provides different applications according to the detection result for output voltage, for example, the over-temperature protection (OTP) or the over-voltage protection (OVP).

Nonetheless, to save circuit costs of the mentioned circuits, different detection methods will be integrated as possible, for sharing circuit resource. For example, the OTP and the OVP can share a divided voltage node and be achieved by time division detection. Namely, in a switching period, the divided voltage node is detected to judge if the system temperature is too high; in another switching period, the same divided voltage node is detected to judge if the output voltage is too high. Unfortunately, by using the time-division detection, it is not possible to execute all the necessary protection mechanisms such as the OTP or the OVP in every switch on/off cycle. To elaborate, if an over-voltage event has already occurred in a switching period while the detection circuit is executing the over-temperature detection, it should be delayed for at least one switching period before the detection circuit can start the OVP, and thus definitely increasing the damage risk of a power supply system.

Accordingly, it is urged to provide a monitoring technology for monitoring a power supply with integrated OTP and OVP.

SUMMARY

An objective of the present application is to provide a method and a circuit for monitoring a power supply. An auxiliary winding is adopted to obtain an auxiliary side voltage of a switching power supply. A voltage division circuit is adopted to obtain a divided voltage of the auxiliary side voltage. A first detection circuit detects the divided voltage. A second detection circuit detects a detection current. By using this method, multiple detection methods can be executed in one switching period for monitoring the power supply.

Another objective of the present application is to provide a method and a circuit for monitoring a power supply. A third detection circuit is further adopted to detect a reverse current flowed thereout.

As to the above objectives, the present application provides a method for monitoring a power supply. First, an auxiliary winding senses a winding voltage of a switching power supply and obtains an auxiliary side voltage. Next, a voltage division circuit divides the auxiliary side voltage and obtains a divided voltage. A first detection circuit detects the divided voltage in a switching period of the switching power supply and generates a first detection signal. A second detection circuit detects a detection current flowing into the second detection circuit in the switching period and generates a second detection signal. Wherein the first detection circuit and the second detection circuit operate in the switching period and when the secondary winding of the switching power supply discharges, so that the first detection signal and the second detection signal correspond to an ambient temperature and an output voltage of the switching power supply, respectively, and hence the power supply is monitored.

The present application provides an embodiment, in the switching period, a third detection circuit detects a reverse current and generates a third detection signal. Wherein the third detection circuit operates in the switching period and when the primary winding of the switching power supply charges. The third detection signal corresponds to an input voltage of the switching power supply.

The present application further provides a circuit for monitoring a power supply, applied to a switching power supply. An auxiliary winding of the switching power supply senses the winding voltage and obtains an auxiliary side voltage. The circuit for monitoring the power supply comprises a voltage division circuit, a first detection circuit, and a second detection circuit. The voltage division circuit includes a first impedance element and a second impedance element. The second impedance element includes a thermistor. The voltage division circuit provides a divided voltage of the auxiliary side voltage. The first detection circuit is coupled between the first impedance element and the second impedance element and detects the divided voltage. The second detection circuit includes a switch coupled between the first impedance element and the second impedance element. In a switching period of the switching power supply, when the second winding of the power supply discharges, the switch is turned off or turned on. When the switch is turned off, the first detection circuit detects the divided voltage and generates a first detection signal. When the switch is turned on, the second detection circuit is coupled to the voltage division circuit to form a detection current flowing to the second detection circuit. The second detection circuit detects the detection current and generates a second detection signal. The first detection signal and the second detection signal correspond to an ambient temperature and an output voltage of the switching power supply, respectively, and hence the power supply is monitored.

DETAILED DESCRIPTION

In order to make the structure and characteristics as well as the effectiveness of the present application to be further understood and recognized, the detailed description of the present application is provided as follows along with embodiments and accompanying figures.

To solve the problems in the detection methods according to the prior art for the OTP and the OVP induced by time division detection, the present application provides a circuit and a method for monitoring a power supply. In the same switching period, a first detection circuit detects a divided voltage of an auxiliary side voltage; a second detection circuit detects a detection current flowing to the second detection circuit. Thereby, multiple detection methods, such as the over-temperature detection and the over-voltage detection, can be executed in the same switching period.

In the following description, various embodiments of the present application are described using figures for describing the present application in detail. Nonetheless, the concepts of the present application can be embodied in various forms. Those embodiments are not used to limit the scope and range of the present application.

Figure 1:
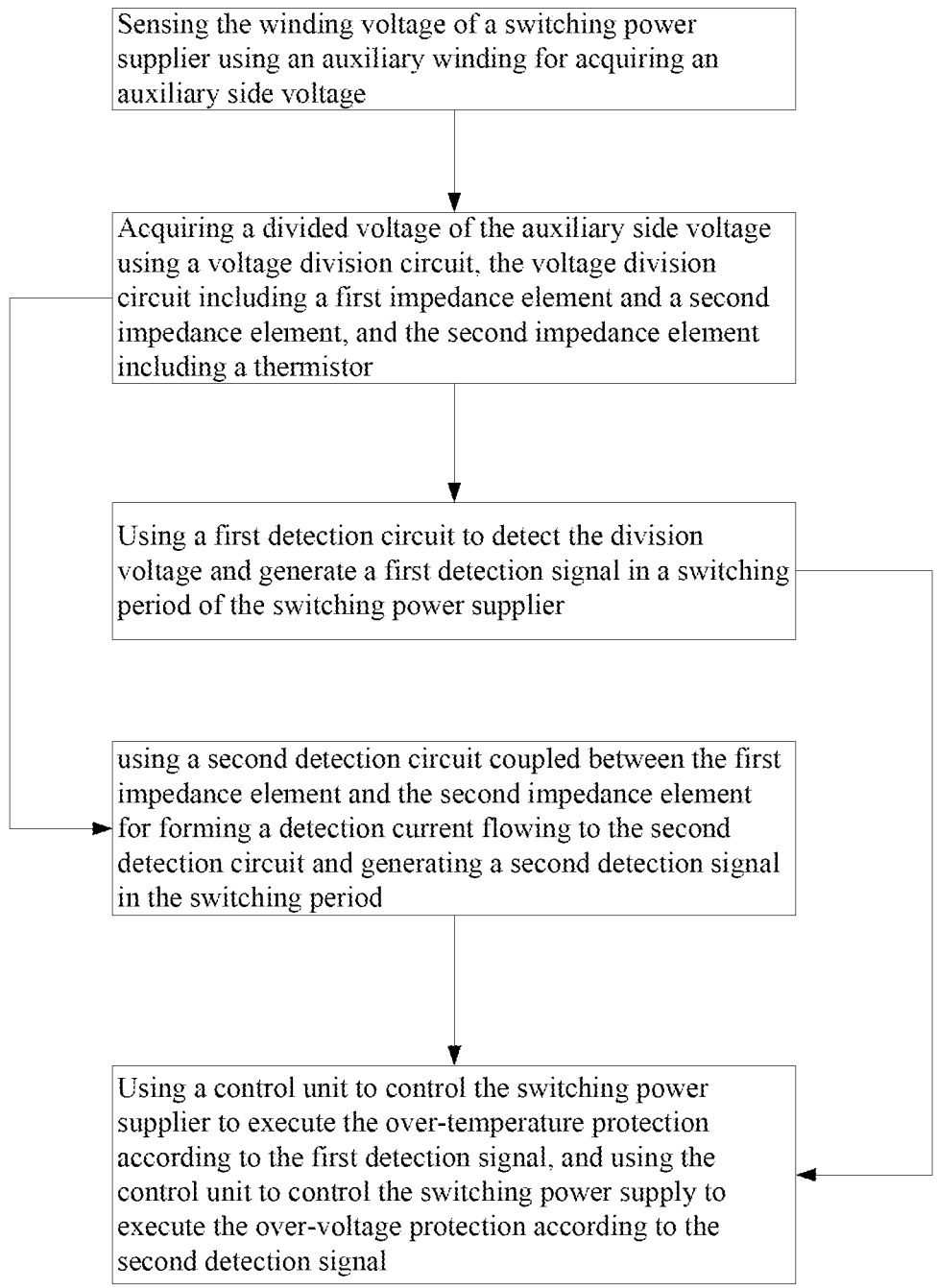
FIG. 1 shows a flowchart of the method for monitoring the power supply according to an embodiment of the present application.

Please refer to FIG. 1, which shows a flowchart of the method for monitoring a power supply according to an embodiment of the present application. To facilitate illustrating the methods for monitoring voltage for various embodiment, the related circuits used by the methods will be described altogether as follows.

Figure 2:
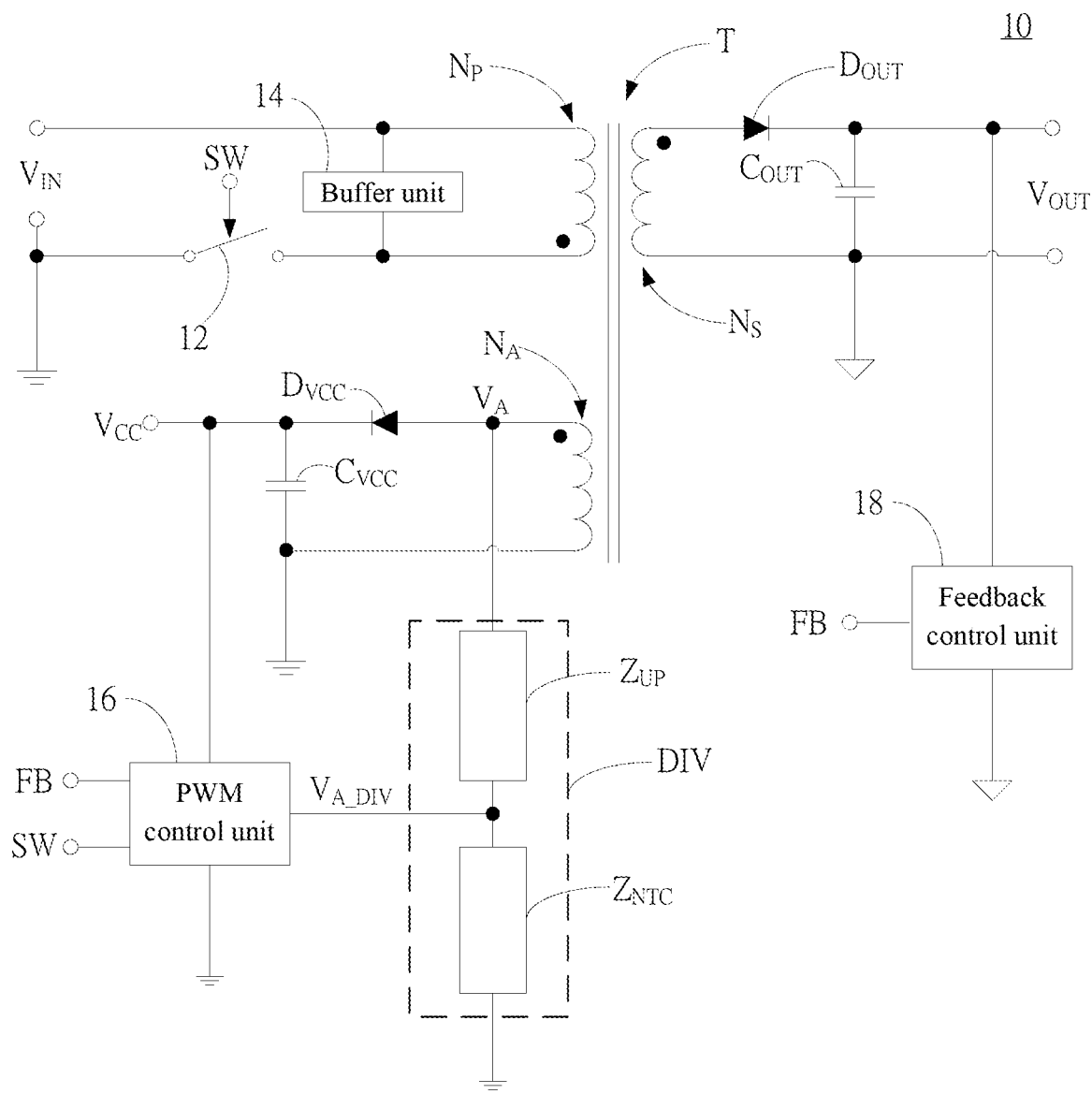
FIG. 2 shows a circuit diagram of the power supply according to the first embodiment of the present application.

Please refer to FIG. 2, which shows a circuit diagram of the power supply according to the first embodiment of the present application. As shown in the figure, a switching power supply 10 according to the present embodiment comprises an input voltage $V_{IN}$, a switch 12, a buffer unit 14, a transformer T, a pulse-width modulation (PWM) control unit 16, and a feedback control unit 18. The transformer T includes a primary winding $N_P$, a secondary winding $N_S$, and an auxiliary winding $N_A$. The primary winding $N_P$ is coupled to the input voltage $V_{IN}$ via the switch 12. The primary winding $N_P$ can also be coupled to the buffer unit 14 for absorbing abnormal noise thereof. The secondary winding $N_S$ is coupled to the feedback control unit 18 via a rectifying diode $D_{OUT}$ and an output capacitor $C_{OUT}$ and outputs an output voltage $V_{OUT}$. The winding coil of the auxiliary winding $N_A$ senses the output voltage $V_{OUT}$ of the secondary winding $N_S$ and obtains an auxiliary side voltage $V_A$. A bias diode $D_{VCC}$ and a bias capacitor $C_{VCC}$ provide a bias VCC to the PWM control unit 16. The PWM control unit 16 receives a feedback signal FB generated by the feedback control unit 18 and generates a switch control signal SW to the switch 12 for controlling the closing or opening of the switch 12 and thus generating the output voltage $V_{OUT}$ via the transformer T.

Figure 3A:
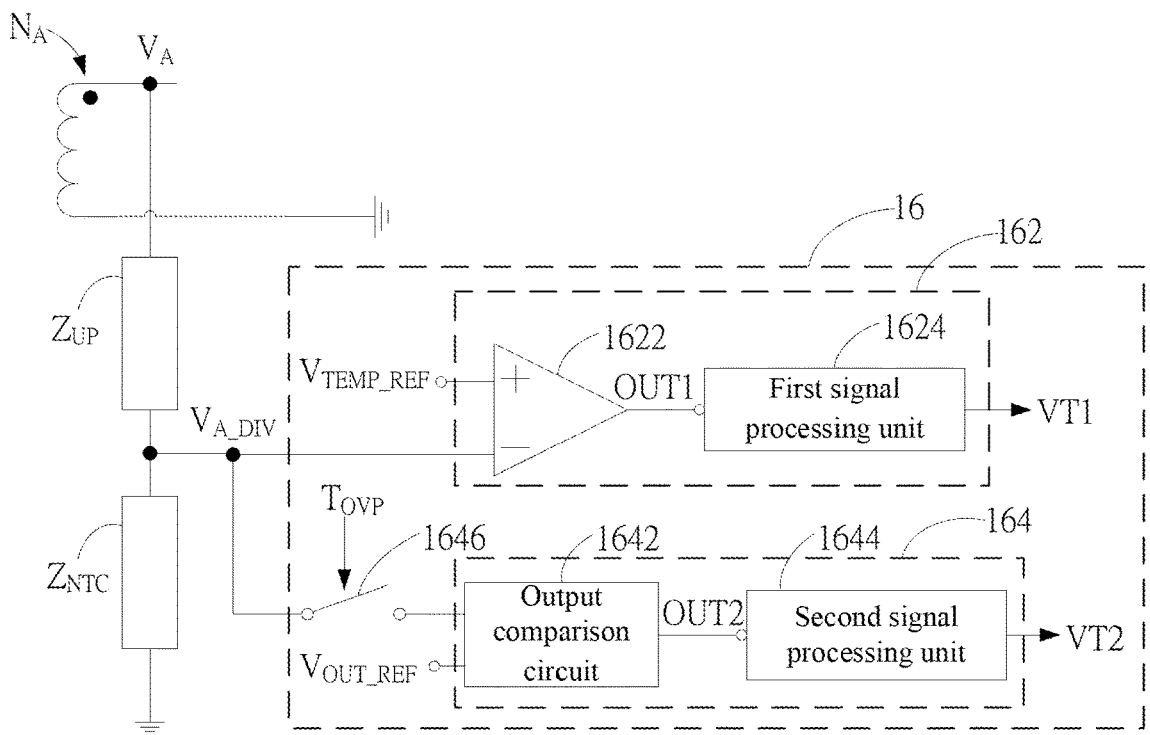
FIG. 3A shows a circuit diagram for detecting ambient temperature in the circuit for monitoring the power supply according to the first embodiment of the present application.

As shown in FIG. 2 to FIG. 3A, the PWM control unit 16 according to the present embodiment provides the monitoring functions for the switching power supply 10 and acts as a monitoring circuit. Alternatively, the monitoring circuit can form an independent circuit block, instead of being integrated in the PWM control unit 16. Nonetheless, the difference will not influence the embodiment of the present application. According to the present embodiment, integrating the monitoring circuit in the PWM control unit 16 is adopted as an example. The PWM control unit 16 includes a first detection circuit 162 and a second detection circuit 164. The first and second detection circuits 162, 164 are coupled to the voltage division circuit DIV. The voltage division circuit DIV includes a first impedance element $Z_{UP}$ and a second impedance element $Z_{NTC}$. A divided voltage $V_{A\_DIV}$ is formed between the first impedance element $Z_{UP}$ and the second impedance element $Z_{NTC}$ according to the auxiliary side voltage $V_A$. According to the present embodiment, the winding coil of the auxiliary winding $N_A$ senses the output voltage $V_{OUT}$ and hence the voltage division circuit DIV can deduce the state of the output voltage $V_{OUT}$ according to the divided voltage $V_{A\_DIV}$ of the auxiliary side voltage $V_A$ between the first impedance element $Z_{UP}$ and the second impedance element $Z_{NTC}$ by means of the auxiliary winding $N_A$. When the output voltage $V_{OUT}$ increases, the auxiliary side voltage $V_A$ sensed by the auxiliary winding $N_A$ and the divided voltage $V_{A\_DIV}$ will increase correspondingly. On the other hand, the second impedance element $Z_{NTC}$ includes a thermistor. The thermistor can have a negative temperature coefficient. Thereby, the overall impedance of the second impedance element $Z_{NTC}$ will change with an ambient temperature. Thereby, the divided voltage $V_{A\_DIV}$ corresponds to the ambient temperature. Nonetheless, the over-temperature detection and the over-voltage detection according to the present application do not simply reply on detecting the divided voltage $V_{A\_DIV}$ by time division just like the prior art.

Figure 3B:
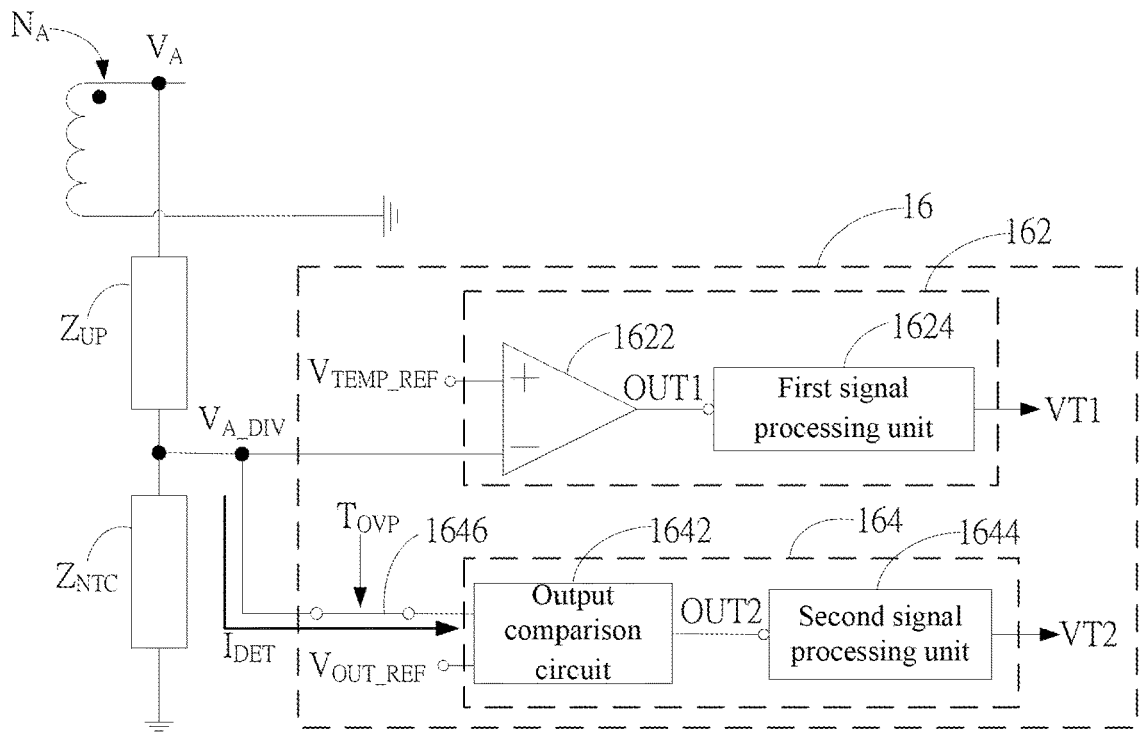
FIG. 3B shows a circuit diagram for detecting output voltage in the circuit for monitoring the power supply according to the first embodiment of the present application.
Figure 4:
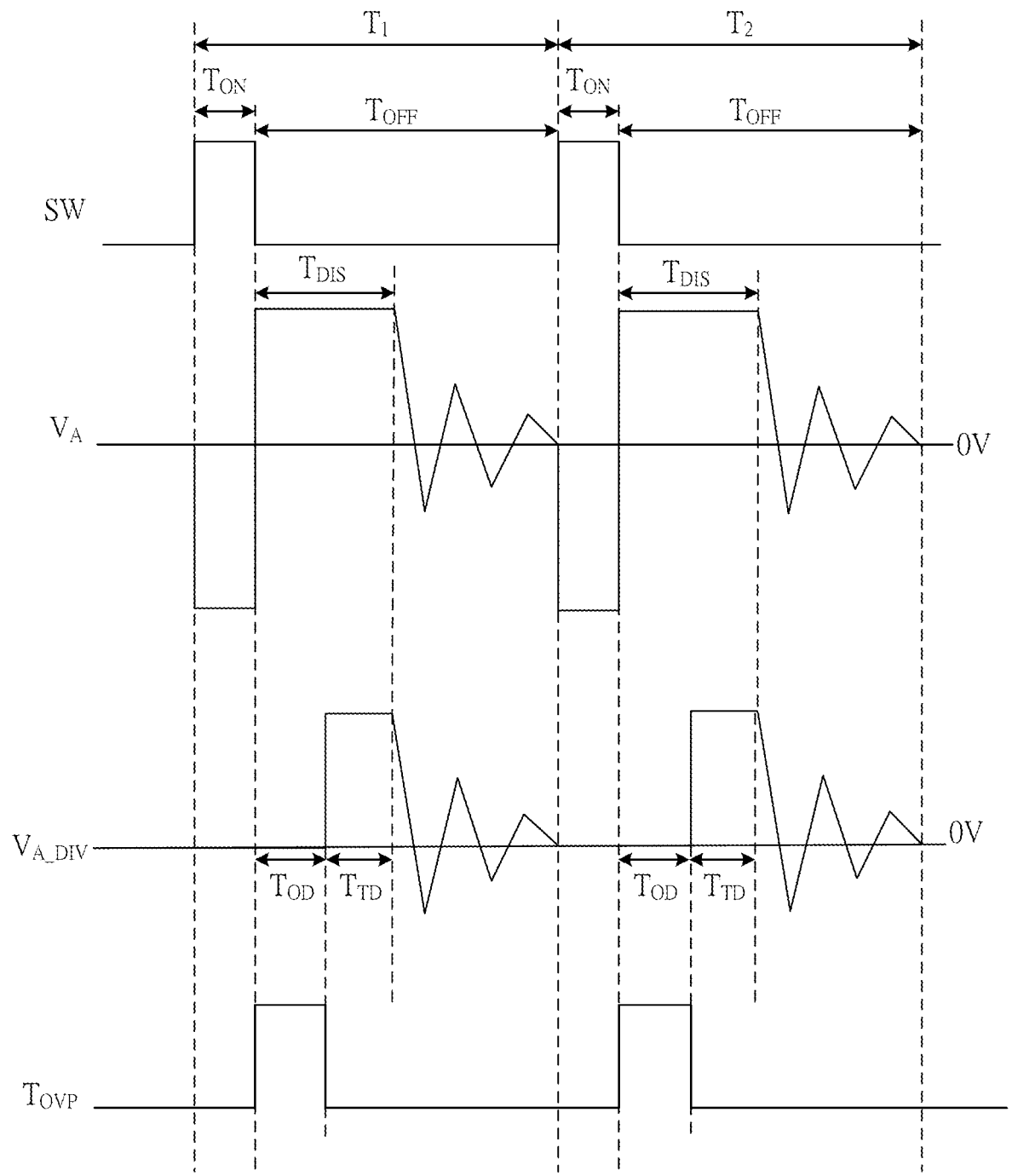
FIG. 4 shows a schematic diagram of the signals according to the first embodiment of the present application.

Please refer to FIG. 3B and FIG. 4. After the PWM control unit 16 acquires the auxiliary side voltage $V_A$ and the divided voltage $V_{A\_DIV}$ using the division circuit DIV in a switching period of the switch 12, the first detection circuit 162 detects the divided voltage $V_{A\_DIV}$ in a temperature detection interval $T_{TD}$ and generates a first detection signal VT1. The switching period can be, for example, a switching period $T_1$ or a switching period $T_2$. Here, only the switching period $T_1$ is adopted for description. In an output-voltage detection interval $T_{OD}$ of the same switching period $T_1$, the second detection circuit 164 is coupled between the first impedance element $Z_{UP}$ and the second impedance element $Z_{NTC}$ and forming a detection current $I_{DET}$ flowing into the second detection circuit 164. The second detection circuit 164 generates a second detection signal VT2 according to the detection current $I_{DET}$ and thus enabling the first and second detection circuits 162, 164 to operate, respectively, in the switching period $T_1$. At this moment, because it is required to use the winding coil of the auxiliary winding $N_A$ to sense the output voltage $V_{OUT}$, the temperature detection interval $T_{TD}$ and the output-voltage detection interval $T_{OD}$ are both operated in a cutoff interval $T_{OFF}$ of the switch 12 when the switch 12 is turned off. This is because within a turn-on interval $T_{ON}$ when the switch 12 is turned on, the transformer T is charging the winding and no output voltage $V_{OUT}$ will be output. Besides, the temperature detection interval $T_{TD}$ and the output-voltage detection interval $T_{OD}$ are preferably within a secondary-winding discharge interval $T_{DIS}$ of the switching power supply 10. To elaborate, a person having ordinary skill in the art should know that in the cutoff interval $T_{OFF}$, the auxiliary side voltage $V_A$ will oscillate after the winding completes discharging, as shown in FIG. 4. Thereby, the first and second detection circuits 162, 164 preferably operate within the secondary-winding discharge interval $T_{DIS}$ when the winding is discharging and the voltage value of the auxiliary side voltage $V_A$ is stable. In short, according to the embodiments of the present application, the first and second detection circuits 162, 164 operate in the same switching period $T_1$ and the second winding of the switching power supply 10 is discharging. Then the first detection signal VT1 and the second detection signal VT2 correspond to an ambient temperature and the output voltage $V_{OUT}$ of the switching power supply 10. Furthermore, the ambient temperature can correspond to the impedance ratio of the first impedance element $Z_{UP}$ to the second impedance element $Z_{NTC}$.

The secondary-winding discharge interval $T_{DIS}$ includes a temperature detection interval $T_{TD}$ of the first detection circuit 162 and an output-voltage detection interval $T_{OD}$ of the second detection circuit 164. In other words, each secondary-winding discharge interval $T_{DIS}$ includes the temperature detection interval $T_{TD}$ and the output-voltage detection interval $T_{OD}$. Namely, in each secondary-winding discharge interval $T_{DIS}$, the first and the second detection circuit 162, 164 both operate. The temperature detection interval $T_{TD}$ and the output-voltage detection interval $T_{OD}$ can be consecutive. Alternatively, a time gap can exist between the temperature detection interval $T_{TD}$ and the output-voltage detection interval $T_{OD}$. In addition, the temperature detection interval $T_{TD}$ can be earlier than the output-voltage detection interval $T_{OD}$ (not shown in the figure). Alternatively, the temperature detection interval $T_{TD}$ can be later than the output-voltage detection interval $T_{OD}$.

Please refer again to FIG. 3A and FIG. 3B. The first detection circuit 162 according to the present embodiment detects the ambient temperature according to the divided voltage $V_{A\_DIV}$ and a temperature reference signal $V_{TEMP\_REF}$ and thus generating the first detection signal VT1; the second detection circuit 164 according to the present embodiment detects the output voltage $V_{OUT}$ according to the detection current $I_{DET}$ and an output-voltage reference signal $V_{OUT\_REF}$. The input impedance of the second detection circuit 164 is preferably much smaller than the second impedance element $Z_{NTC}$ so that when the second detection circuit 164 is coupled to the division circuit DIV, almost all the current following through the first impedance element $Z_{UP}$ will flow into the second detection circuit 164 and forming the detection current $I_{DET}$. In this condition, the magnitude of the detection current $I_{DET}$ can reflect the magnitude of the auxiliary side voltage $V_A$ and thus provide information for judging the status of the output voltage $V_{OUT}$. For example, the value of the output voltage $V_{OUT}$ can be judged according to the winding ratio of the second winding $N_S$ to the auxiliary winding $N_A$.

In particular, the first detection circuit 162 includes a comparator 1622 and a first signal processing unit 1624. A positive input of the comparator 1622 is coupled to the temperature reference signal $V_{TEMP\_REF}$; a negative input of the comparator 1622 is coupled between the first impedance element $Z_{UP}$ and the second impedance element $Z_{NTC}$ and thus receives the divided voltage $V_{A\_DIV}$. Thereby, by comparing the temperature reference signal $V_{TEMP\_REF}$ and the divided voltage $V_{A\_DIV}$, a first comparison result OUT1 will be generated and transmitted to the first signal processing unit 1624, which then generates the first detection signal VT1 according to the first comparison result OUT1. If the thermistor resistor of the second impedance element $Z_{NTC}$ includes a negative temperature coefficient, the overall second impedance element $Z_{NTC}$ will decrease as the temperature rises. Given the other conditions fixed, the divided voltage $V_{A\_DIV}$ will decrease as the temperature rises as well. Thereby, by properly setting the temperature reference signal $V_{TEMP\_REF}$, the first detection circuit 162 can judge if the ambient temperature exceeds a predetermined temperature.

The second detection circuit 164 includes a switch 1646, an output comparison circuit 1642, and a second signal processing unit 1644. The switch 1646 can be controlled by an output-voltage detection signal $T_{OVP}$ for closing or opening. One terminal of the output comparison circuit 1642 is coupled to the output-voltage reference signal $V_{OUT\_REF}$. The other terminal of the output comparison circuit 1642 is coupled between the first impedance element $Z_{UP}$ and the second impedance element $Z_{NTC}$ when the switch 1646 is turned on to enable the detection current $I_{DET}$ to flow into the second detection circuit 164. Thereby, the output comparison circuit 1642 compares the detection current $I_{DET}$ with the output-voltage reference signal $V_{OUT\_REF}$, and generates and transmits a second comparison result OUT2 to the second signal processing unit 1644, so that the second signal processing unit 1644 can generate the second detection signal VT2 according to the second comparison result OUT2. As described above, the magnitude of the detection current $I_{DET}$ can be used to judge the magnitude of the output voltage $V_{OUT}$. By properly setting the output-voltage reference signal $V_{OUT\_REF}$, the second detection circuit 164 can judge if the output voltage $V_{OUT}$ exceeds a predetermined voltage.

Furthermore, the PWM control unit 16 can control the switching power supply 10 to execute an OTP according to the first detection signal VT1 and an OVP according to the second detection signal VT2. The OTP and the OVP are general protective mechanisms for switching power supplies. Hence, the details will not be described again.

Figure 5A:
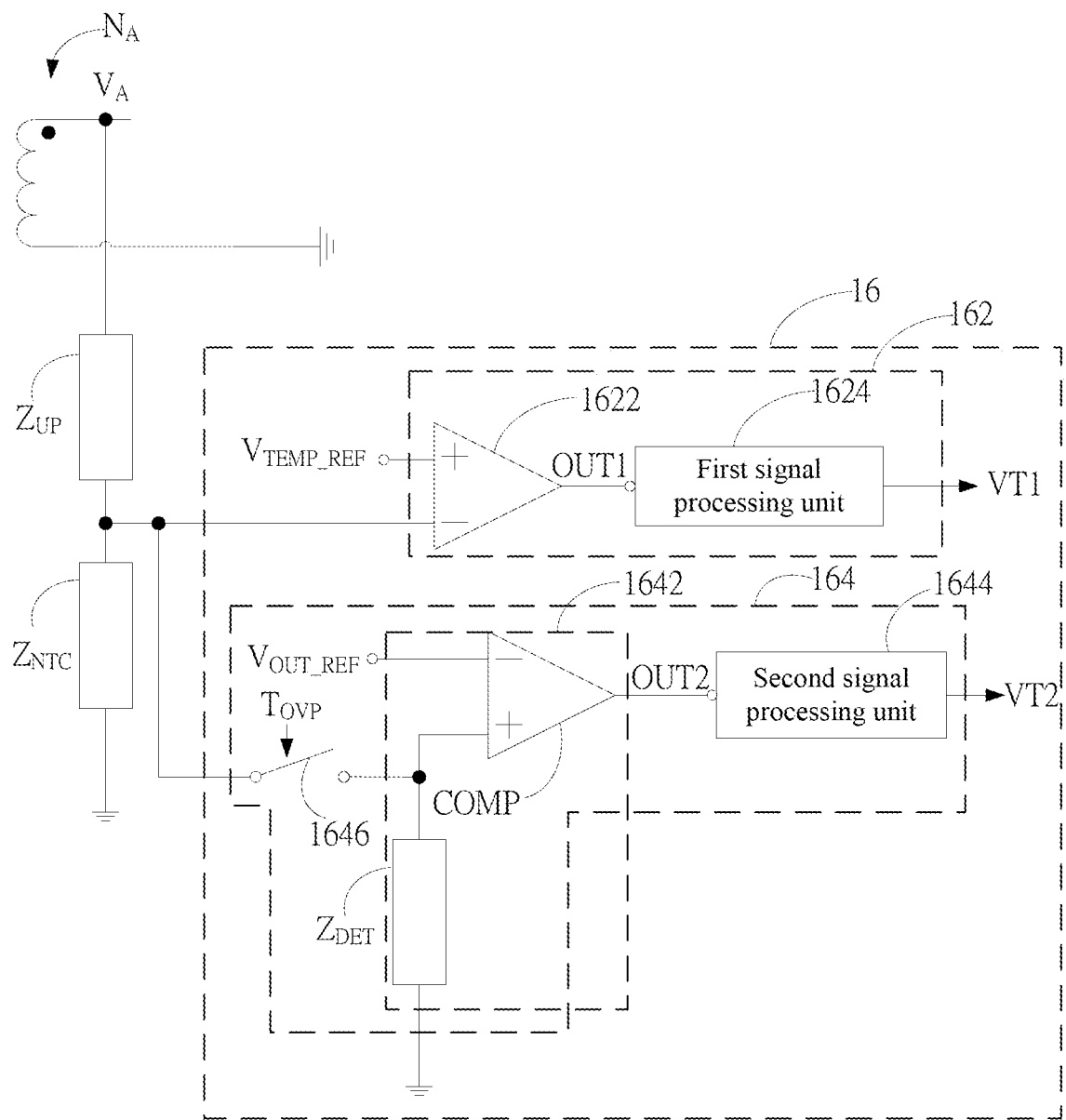
FIG. 5A shows an exemplary circuit diagram for detecting ambient temperature in the circuit for monitoring the power supply according to the first embodiment of the present application.
Figure 5B:
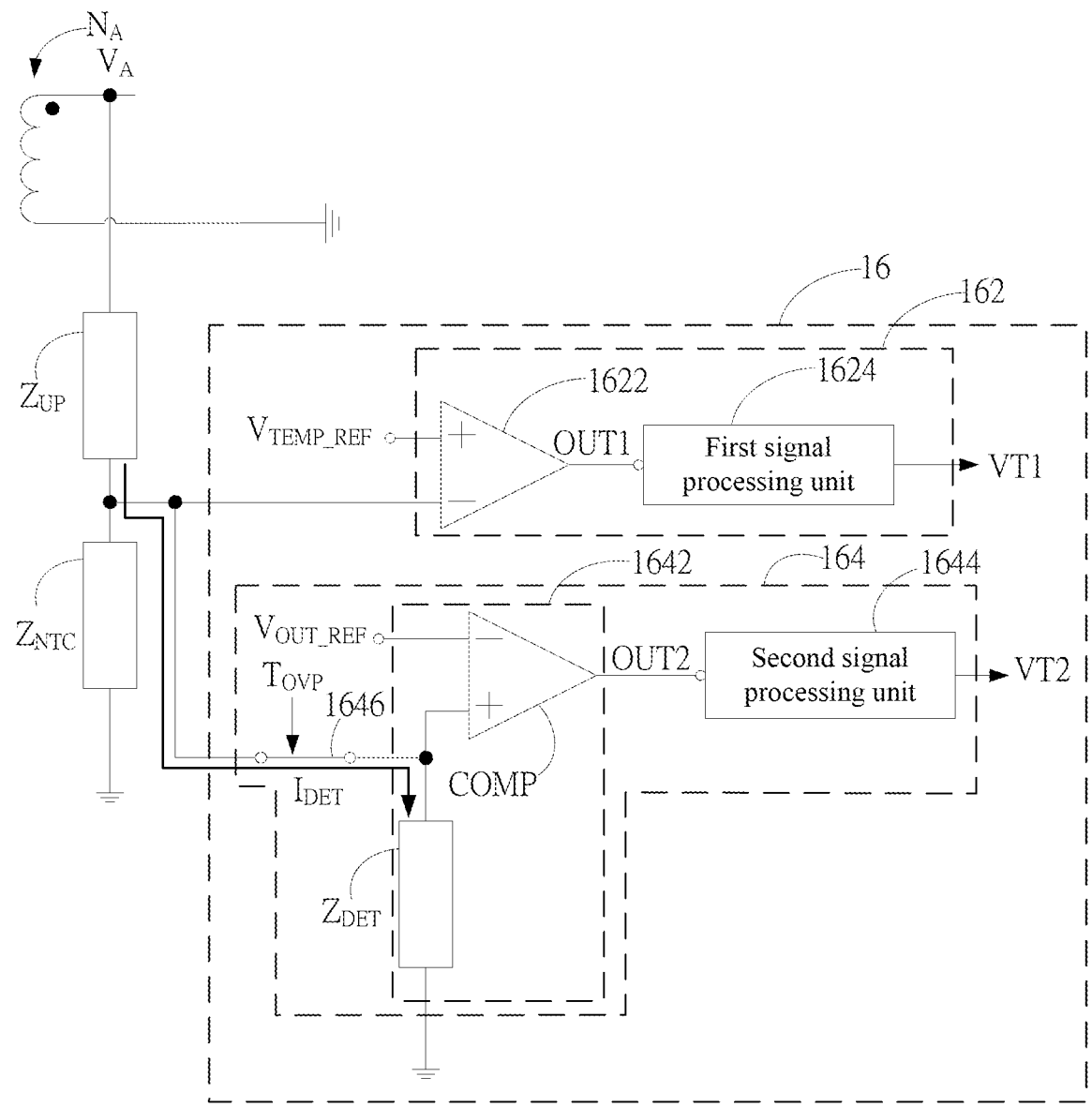
FIG. 5B shows an exemplary circuit diagram for detecting output voltage in the circuit for monitoring the power supply according to the first embodiment of the present application.

FIG. 5A and FIG. 5B show schematic diagrams of the second detection circuit 164 when the switch 1646 is opened and closed according to an exemplary circuit in the first embodiment of the present application. The output comparison circuit 1642 of the second detection circuit 164 includes an input impedance $Z_{DET}$ and a comparator COMP. The impedance of the input impedance $Z_{DET}$ is smaller than the impedance of the second impedance element $Z_{NTC}$. Thereby, when the switch 1646 is closed, the current flowing through the second impedance element $Z_{NTC}$ originally will turn to flow through the input impedance $Z_{DET}$ of the second detection circuit 164 instead. Then the second detection circuit 164 can compare the product of the detection current $I_{DET}$ and the input impedance $Z_{DET}$ with the output-voltage reference signal $V_{OUT\_REF}$ for detecting the output voltage $V_{OUT}$.

Figure 6A:
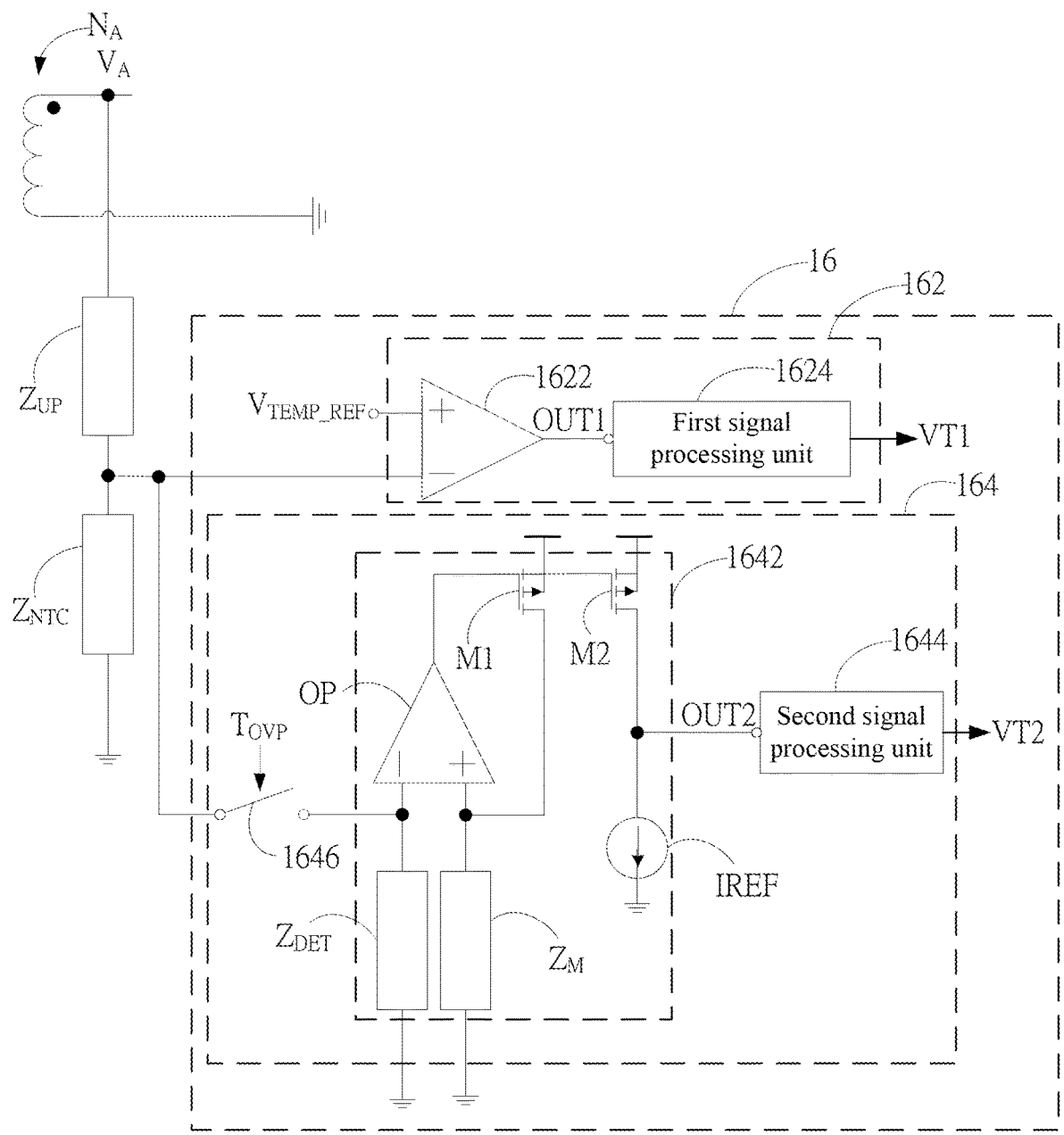
FIG. 6A shows another exemplary circuit diagram for detecting ambient temperature in the circuit for monitoring the power supply according to the first embodiment of the present application.
Figure 6B:
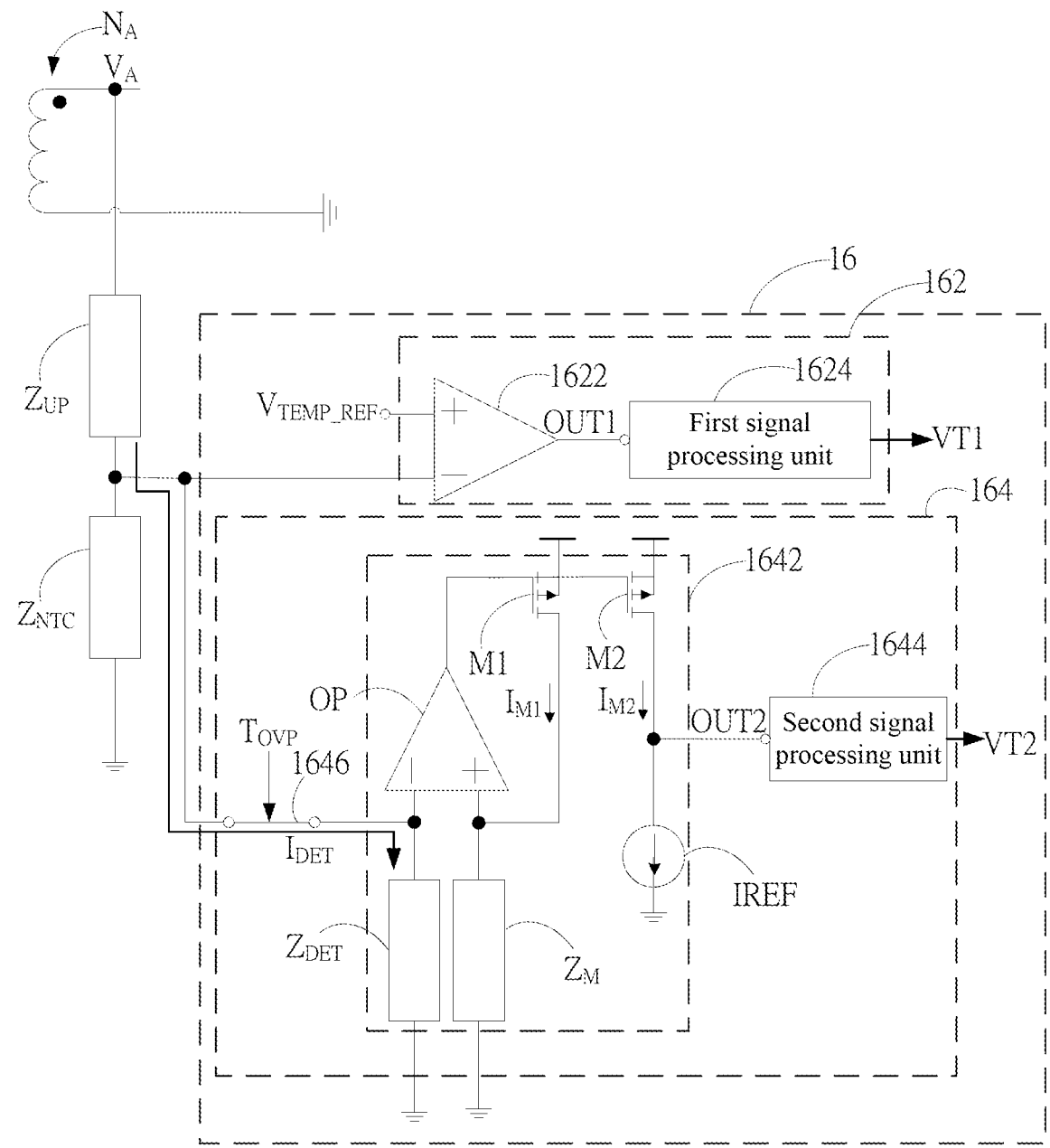
FIG. 6B shows another exemplary circuit diagram for detecting output voltage in the circuit for monitoring the power supply according to the first embodiment of the present application.

Furthermore, FIG. 6A and FIG. 6B show schematic diagrams of the second detection circuit 164 when the switch 1646 is opened and closed according to another exemplary circuit in the first embodiment of the present application. The output comparison circuit 1642 of the second detection circuit 164 includes the input impedance $Z_{DET}$, a mirror impedance $Z_M$, an operational amplifier OP, a first transistor M1, a second transistor M2, and a reference current source $I_{REF}$. A positive input of the operational amplifier OP is coupled to mirror impedance $Z_M$ and a drain of the first transistor M1. A negative input of the operational amplifier OP is coupled to the input impedance $Z_{DET}$ and the switch 1646. An output of the operational amplifier OP is coupled to the gate of the first transistor M1 and the second transistor M2. Thereby, when the switch 1646 is closed, the detection current $I_{DET}$ will flow into the input impedance $Z_{DET}$. Then the mirror impedance $Z_M$ can mirror the detection current $I_{DET}$ and form a first current IM1. The current mirror formed by the first and second transistors M1, M2 will convert the first current $I_{M1}$ to a second current $I_{M2}$, which is compared with the reference current source IREF for detecting the output voltage $V_{OUT}$. According to the exemplary circuit, the reference current source IREF is essentially an embodiment of the output reference signal $V_{OUT\_REF}$ as described above.

In the following, simple values are adopted for illustrating the characteristics of the exemplary circuit shown in FIGS. 6A and 6B. Assuming that the first current $I_{M1}$ is K times of the detection current $I_{DET}$ and the second current $I_{M2}$ is M times of the first current $I_{M1}$, the following equations can be used to ser the temperature reference signal $V_{TEMP\_REF}$ and the reference current source IREF:

$$V_A \times \frac{Z_{NTC}}{Z_{UP} + Z_{NTC}} = V_{TEMP\_REF}$$

$$\frac{V_A}{Z_{UP}} \times \frac{K}{M} \approx I_{REF}$$

According to the differences between FIG. 5A to FIG. 5B and FIG. 6A to FIG. 6B, it is apparent that there exist many embodiments of detailed circuits for the detection circuit 16 according to the first embodiment of the present application. All the embodiments can be applied to monitor the switching power supply 10 by executing multiple detection methods in the same switching period according to the present application.

Figure 7:
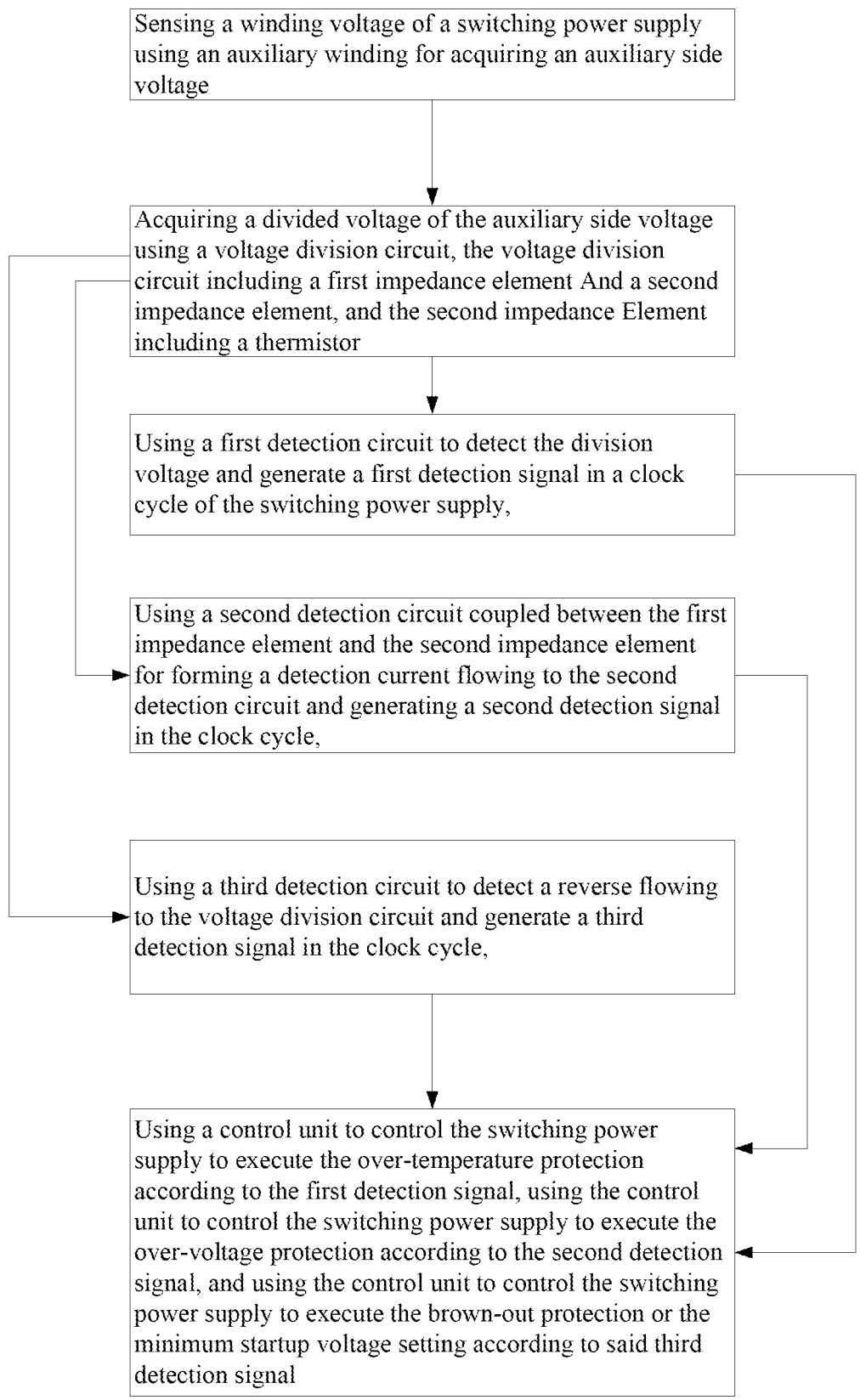
FIG. 7 shows a flowchart of the method for monitoring power supply according to another embodiment of the present application.

Please refer to FIG. 7, which shows a flowchart of the method for monitoring power supply according to another embodiment of the present application. To facilitate illustrating the methods for monitoring voltage for various embodiment, the related circuits used by the methods will be described altogether as follows.

Figure 8A:
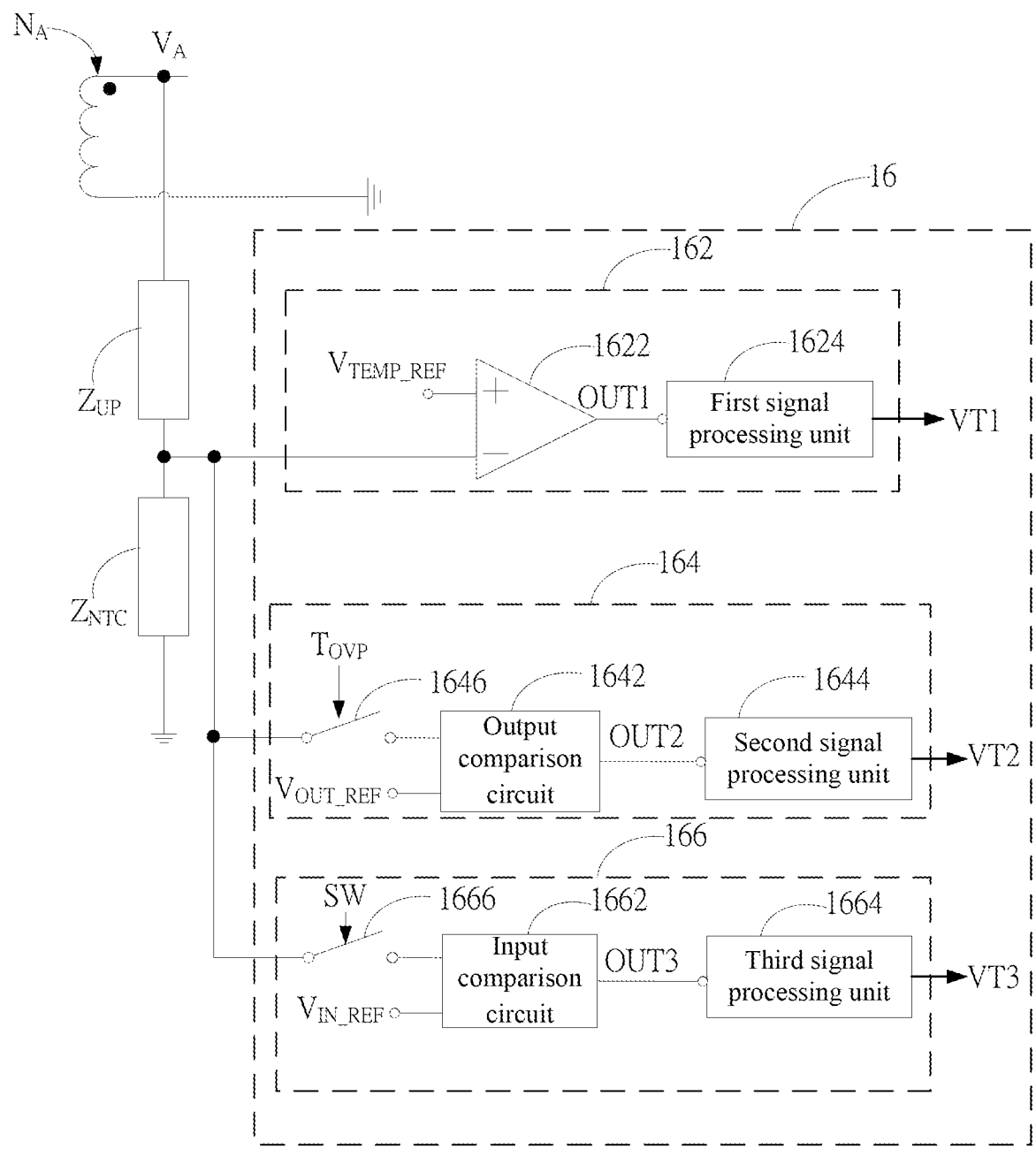
FIG. 8A shows another circuit diagram for detecting ambient temperature in the circuit for monitoring the power supply according to the second embodiment of the present application.
Figure 8B:
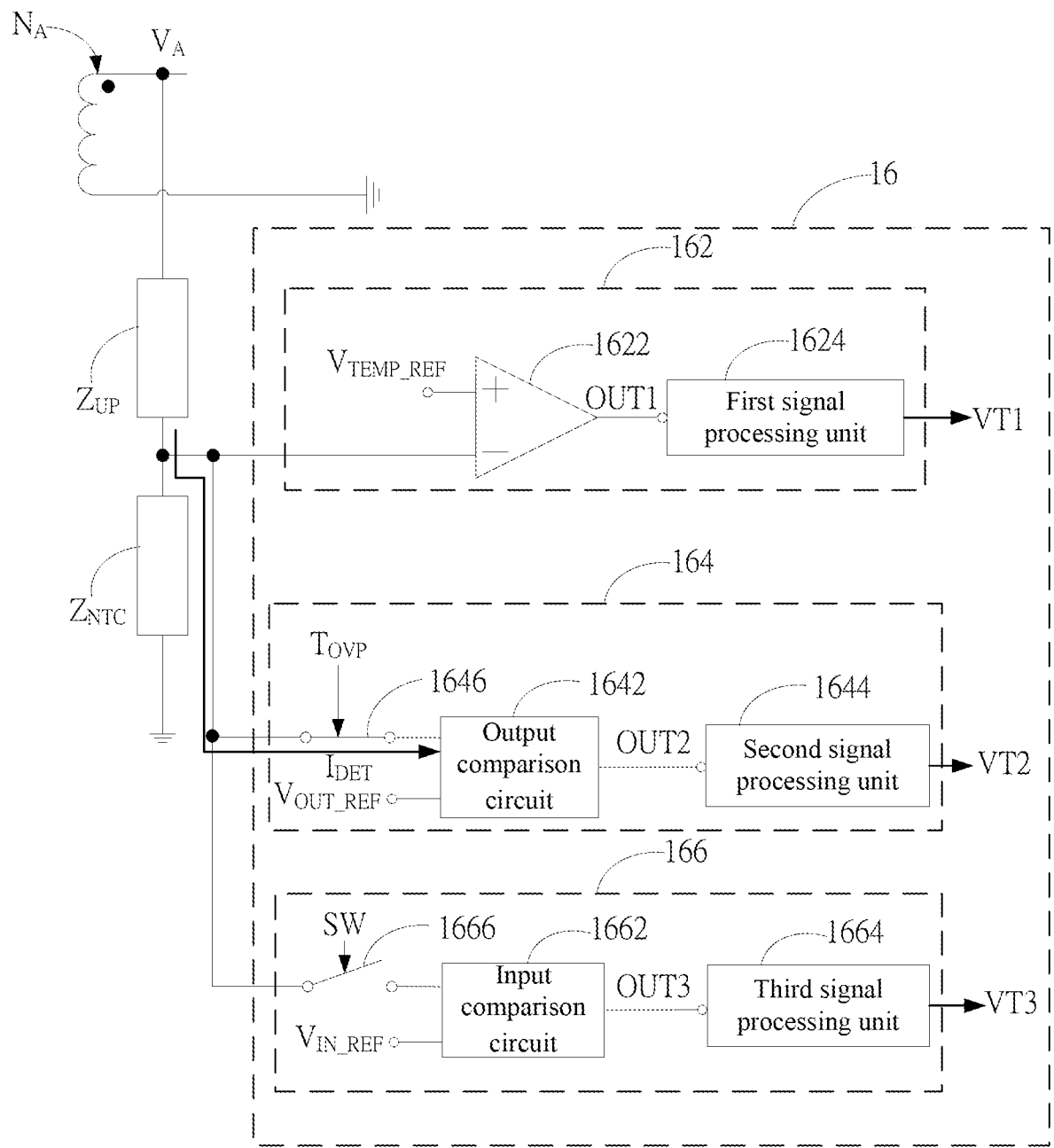
FIG. 8B shows another circuit diagram for detecting output voltage in the circuit for monitoring the power supply according to the second embodiment of the present application.

FIG. 8A to FIG. 3C show circuit diagrams of the power supply according to the second embodiment of the present application. The difference between the second embodiment and the first embodiment is that FIG. 8A to FIG. 3C further uses a third detection circuit 166 to detect a reverse current $I_{ZUP}$ in the switching period $T_1$ for detecting the input voltage VD of the switching power supply 10. The third detection circuit 166 includes an input comparison circuit 1662, a third signal processing unit 1664, and a switch 1666. One terminal of the input comparison circuit 1662 is coupled to the switch 1666. The other terminal of the input comparison circuit 1662 is coupled to an input reference signal $V_{IN\_REF}$. The switch 1666 can be controlled by the switch control signal SW of the switch 12 for closing or opening. When the switch 1666 is closed, the third detection circuit 166 is coupled to the divided voltage circuit DIV. The third detection circuit 1666 is coupled between the first impedance element $Z_{UP}$ and the second impedance element $Z_{NTC}$ in an input-voltage detection interval $T_{IND}$ within the same switching period $T_1$ when the first and second detection circuits 162, 164 operate and thus forming a reverse current $I_{ZUP}$ flowing from the third detection circuit 166 to the voltage division circuit DIV. The input-voltage detection interval $T_{IND}$ is operated in a turn-on interval $T_{ON}$ when the switch 12 is closed. This is because in the turn-on interval $T_{ON}$, the transformer T is charging the windings and thus inducing the negative auxiliary side voltage $V_A$ across the auxiliary winding $N_A$. Consequently, according to the present embodiment, the switch control signal SW can be used to control the switch 1666 of the third detection circuit 166.

Figure 8C:
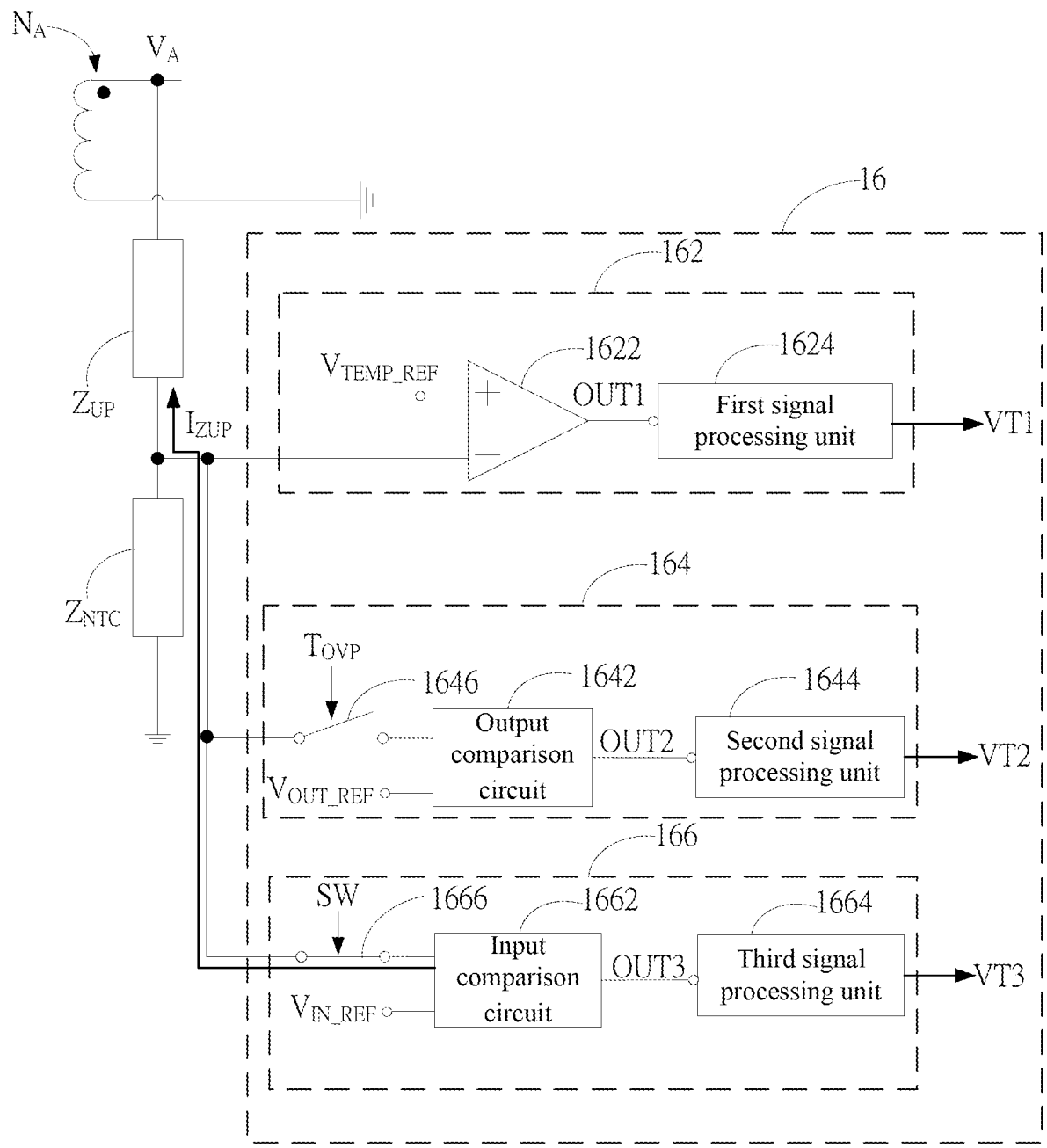
FIG. 8C shows another circuit diagram for detecting input voltage in the circuit for monitoring the power supply according to the second embodiment of the present application.
Figure 9:
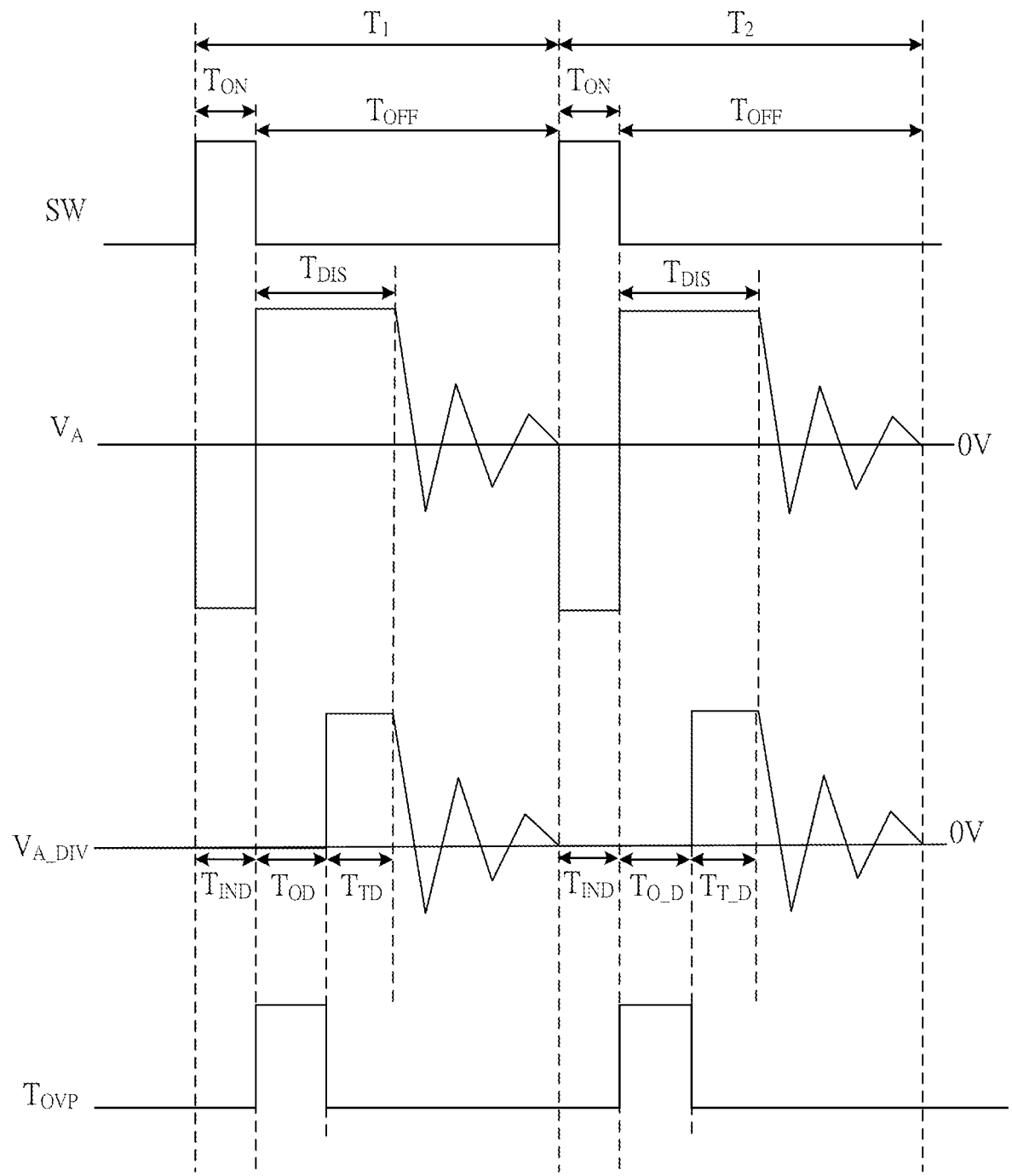
FIG. 9 shows a schematic diagram of the signals according to the second embodiment of the present application.

Furthermore, as shown in FIG. 8C, the switch 166 is closed by the enable (high-level) signal of the switch control signal SW. Thereby, the input comparison circuit 1662 is coupled between the first impedance element $Z_{UP}$ and the second impedance element $Z_{NTC}$. At this moment, since the auxiliary side voltage is negative $V_A$, the reverse current $I_{ZUP}$ will flow through the first impedance element $Z_{UP}$. As shown in FIG. 9, the enable interval of the switch control signal SW is equivalent to the input-voltage detection interval $T_{IND}$ of the third detection circuit 166. At this time, the input comparison circuit 1662 compares the reverse current $I_{ZUP}$ with the input-voltage reference signal $V_{IN\_REF}$, and generating and transmitting a third comparison result OUT3 to the third signal processing unit 1664 so that the third signal processing unit 1664 can generate a third detection signal VT3 according to the third comparison result OUT3. The magnitude of the reverse current $I_{ZUP}$ can be used to judge the magnitude of the input voltage $V_{IN}$. By properly setting the input-voltage reference signal $V_{IN\_REF}$, the third detection circuit 166 can judge if the input voltage $V_{IN}$ exceeds a predetermined voltage.

Figure 10A:
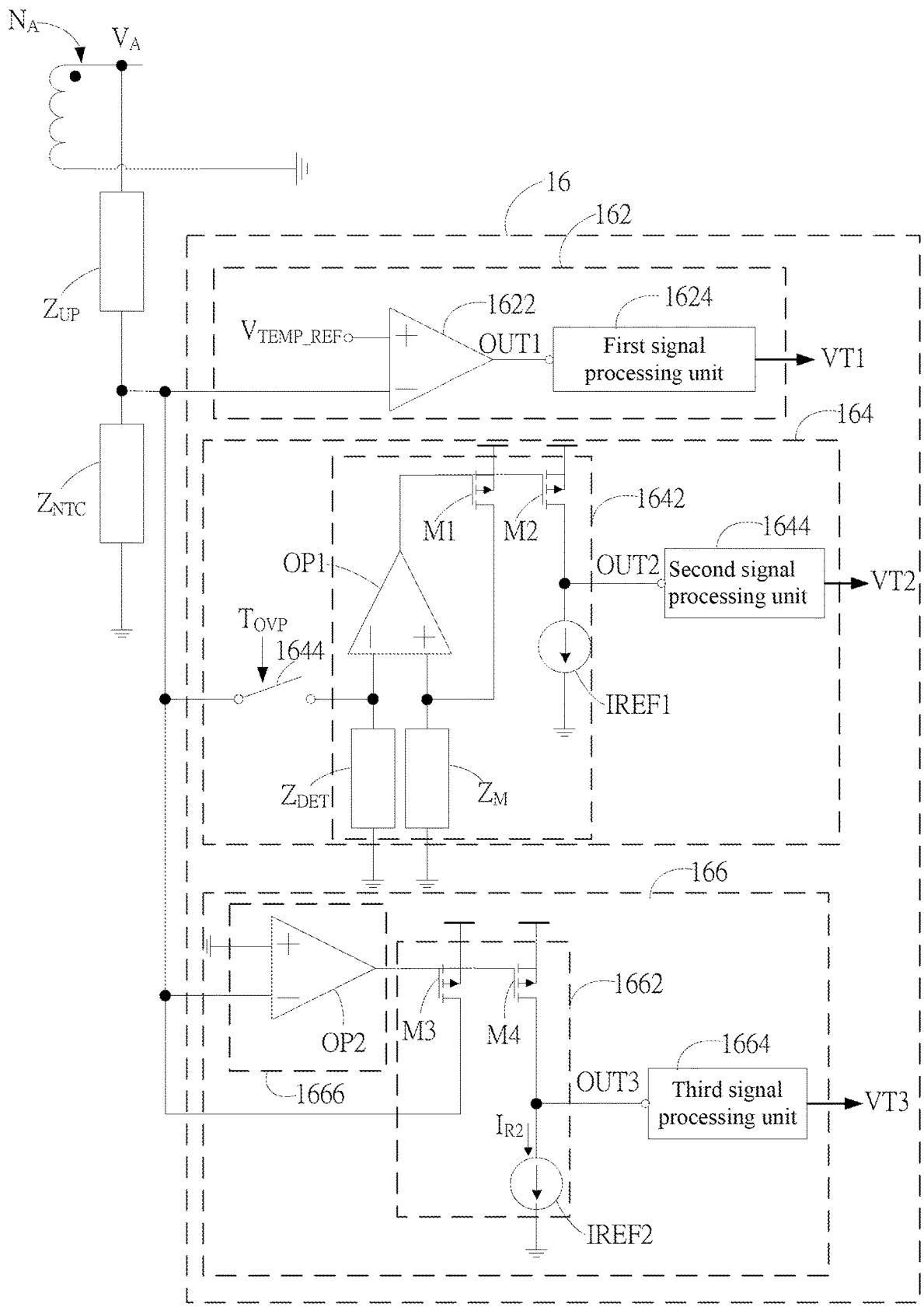
FIG. 10A shows an exemplary circuit diagram for detecting ambient temperature in the circuit for monitoring the power supply according to the second embodiment of the present application.
Figure 10B:
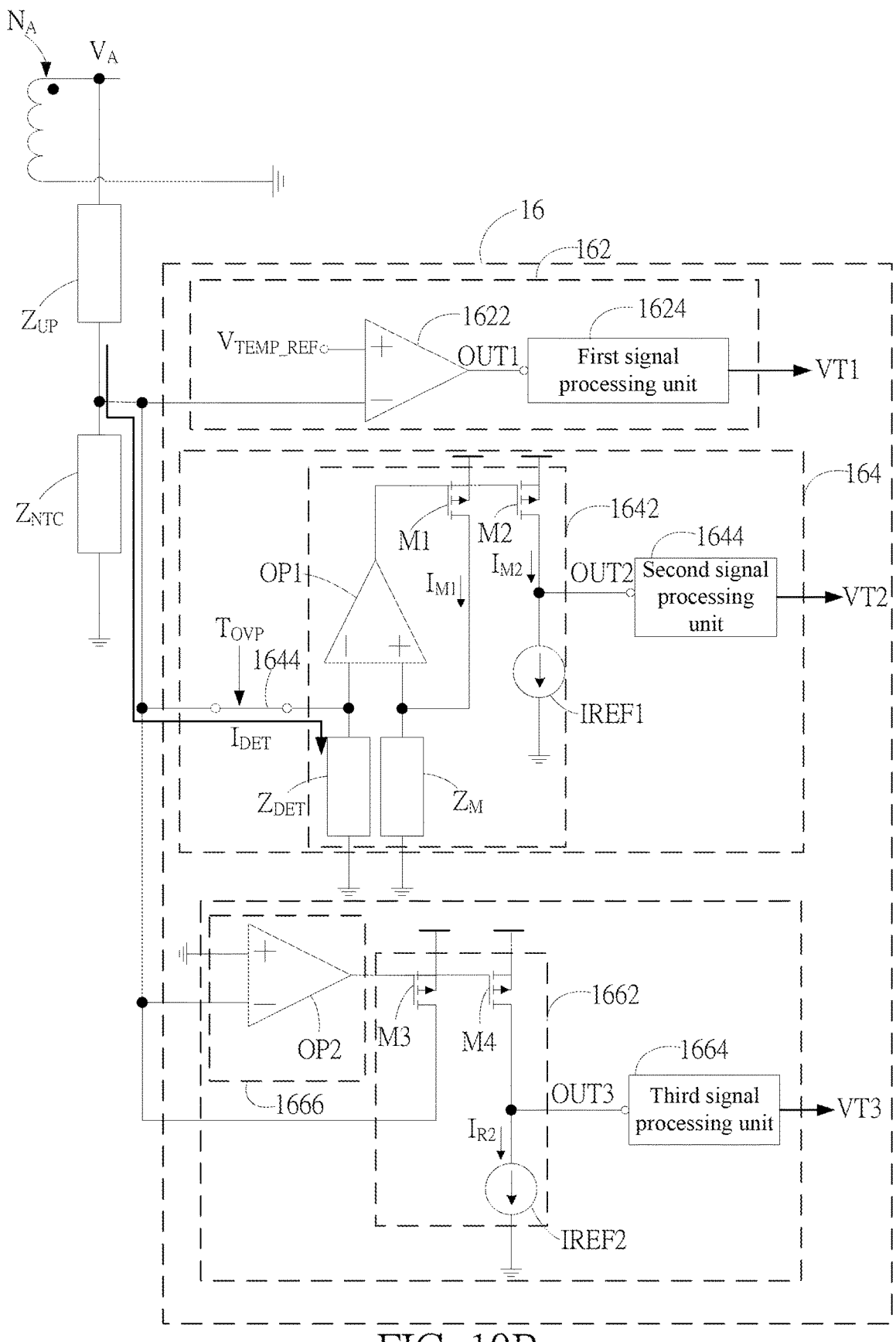
FIG. 10B shows an exemplary circuit diagram for detecting output voltage in the circuit for monitoring the power supply according to the second embodiment of the present application.
Figure 10C:
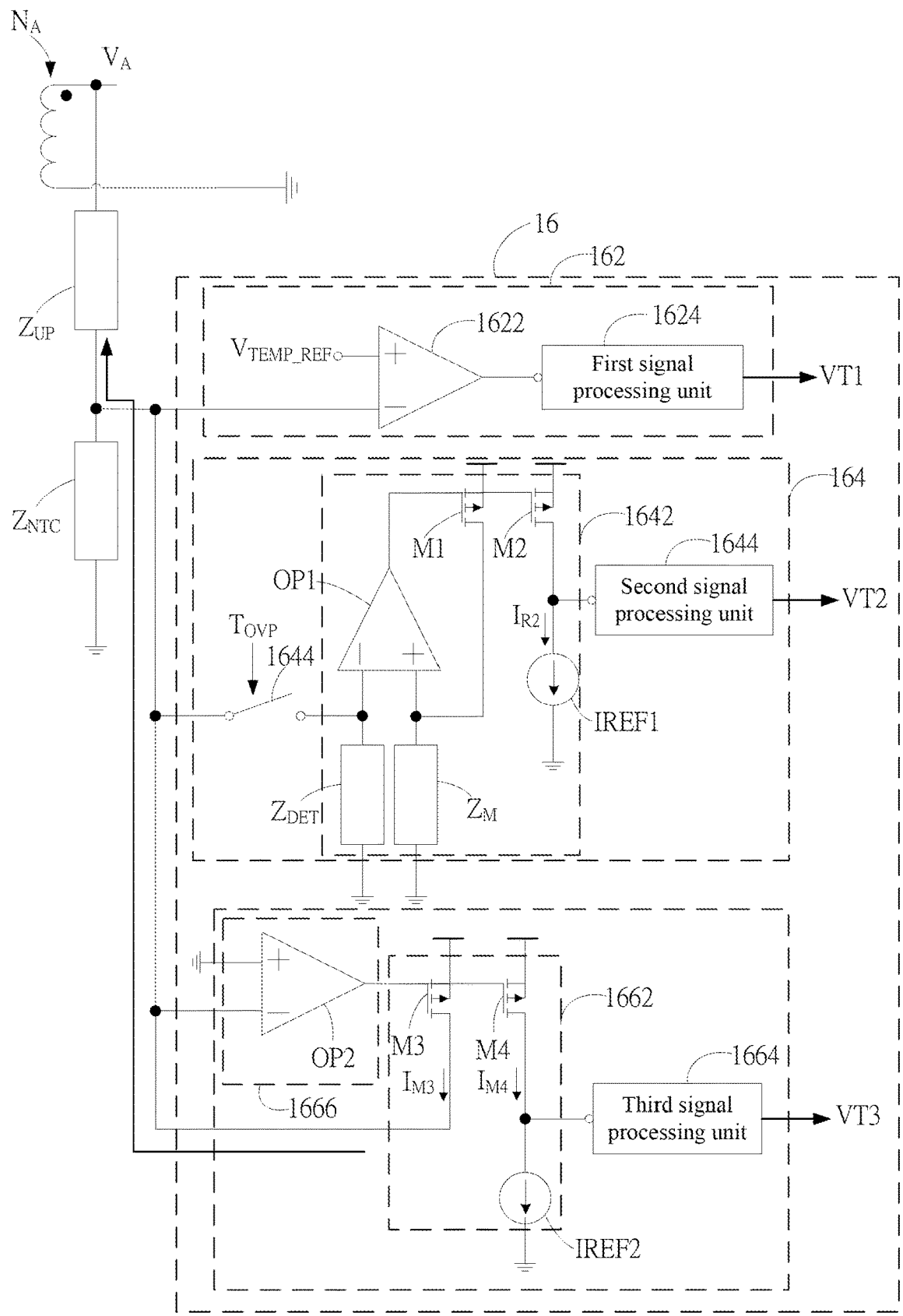
FIG. 10C shows an exemplary circuit diagram for detecting input voltage in the circuit for monitoring the power supply according to the second embodiment of the present application.

Moreover. FIG. 10A to FIG. 10C show schematic diagrams of the exemplary circuits of the second and third detection circuits 164, 166 when the switch 1646, 1666 are opened and closed according to the second embodiment of the present application. The input comparison circuit 1662 of the third detection circuit 166 includes a current mirror formed by a third transistor M3 and a fourth transistor M4.

The switch 166 includes a second operational amplifier OP2. A positive input of the second operational amplifier OP2 is coupled to the ground. In other words, the second operational amplifier OP2 will not couple the third detection circuit 166 to the voltage division circuit DIV unless the divided voltage is equal to or smaller than zero. A negative input of the second operational amplifier OP2 is coupled between the first impedance element $Z_{UP}$ and the second impedance element $Z_{NTC}$. An output of the second operational amplifier OP2 is coupled to the gates of the third and the fourth transistors M3, M4 of the input comparison circuit 1662. Thereby, the second operational amplifier OP2 equivalently controls whether the input comparison circuit 1662 and the voltage division circuit DIV are connected, which is similar to the case in the second embodiment that the switch 1666 will be closed when the switch control signal SW of the switch 122 is enabled (high level). Under the auxiliary side voltage $V_A$ is negative, since the third and the fourth transistors M3, M4 are turned on, the reverse current $I_{ZUP}$ flowing from the third transistor M3 to the first impedance element $Z_{UP}$ forms a third current $I_{M3}$. The third current $I_{M3}$ is converted by the current mirror formed by the third and the fourth transistor M3, M4 and then the fourth transistor M4 outputs a fourth current $I_{M4}$, correspondingly. Thereby, the third signal processing unit 1664 generates the third detection signal VT3 corresponding to the input voltage $V_{IN}$ according to the fourth current $I_{M4}$ and a second reference current source IREF2. Since the third detection circuit 166 operates in the switching period when the primary winding of the switching power supply 10 is charging $N_P$, the third detection signal VT3 corresponds to the input voltage $V_{IN}$ of the switching power supply 10. The rest connection and signal operations are equivalent to the description for FIG. 6A and FIG. 6B. Hence, the details will not be described again.

The PWM control unit 16 controls the switching power supply 10 to execute the OTP according to the first detection signal VT1; the control unit 16 controls the switching power supply 10 to execute the OVP according to the second detection signal VT2. Additionally, the third detection signal VT3 can be used to control the switching power supply 10 to execute the brown-out protection, the minimum startup voltage setting, or the input-voltage switching.

It is noteworthy that according to the method and the circuit for monitoring the power supply according to the second embodiment of the present application, at least three detection methods are executed in the same switching period. Then once the three parameters, including the temperature reference signal $V_{TEMP\_REF}$, the first reference current source IREF1 (the output-voltage reference signal $V_{OUT\_REF}$), and the second reference current source IREF2 (the input reference signal $V_{IN\_REF}$), are set, to adjust individually later on, it might need to change the winding turns of the primary winding $N_P$, the secondary winding $N_S$, or the auxiliary winding $N_A$. Thereby, please refer to FIG. 11A. According to the second embodiment of the present application, by re-designing the first impedance element $Z_{UP}$ of the voltage division circuit DIV, the first impedance element $Z_{UP}$ includes a first resistor R1 and a second resistor R2. Besides, the second resistor R2 is shorted (by using a diode D1 as an example) when the reverse current $I_{ZUP}$ described above is flowing. In other words, when the detection current $I_{DET}$ and the reverse current $I_{ZUP}$ described above are flowing, the first impedance element $Z_{UP}$ should have a different equivalent impedance value. Thereby, the above problem of changing the winding turns of the transformer T for adjusting the three parameters can be avoided.

Figure 11A:
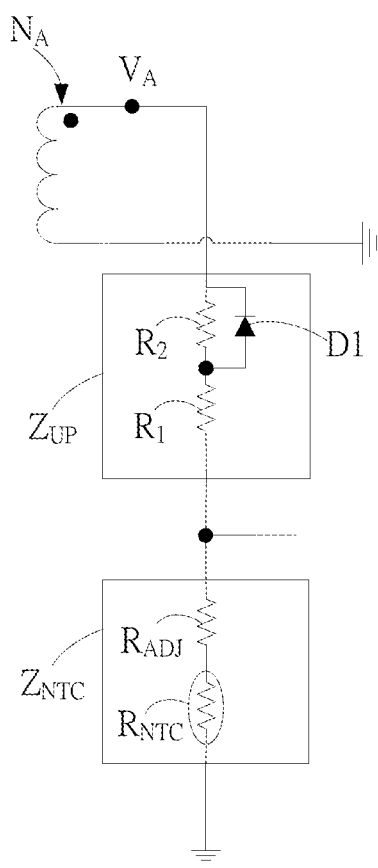
FIG. 11A shows an exemplary circuit diagram of voltage division in the circuit for monitoring the power supply according to the second embodiment of the present application.
Figure 11B:
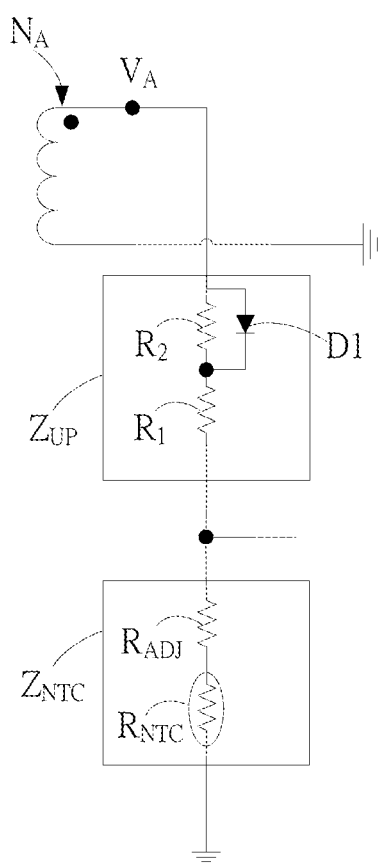
FIG. 11B shows another exemplary circuit diagram of voltage division in the circuit for monitoring the power supply according to the second embodiment of the present application.

Likewise, please refer to FIG. 11B. According to the second embodiment of the present application, by further re-designing the first impedance element $Z_{UP}$ of the voltage division circuit DIV, the first impedance element $Z_{UP}$ includes a first resistor R1 and a second resistor R2. Besides, the second resistor R2 is shorted (by using a diode D1 as an example) when the reverse current $I_{ZUP}$ described above is flowing. In other words, when the detection current $I_{DET}$ and the reverse current $I_{ZUP}$ described above are flowing, the first impedance element $Z_{UP}$ can have a different equivalent impedance value for avoiding the above problem and substantially enhancing the practicability of the circuit for monitoring the power supply. Furthermore, as shown in FIG. 11A and FIG. 11B, the second impedance element $Z_{NTC}$ can include a thermistor $R_{NTC}$ and an adjustment resistor $R_{ADJ}$ for adjusting the overall impedance value of the second impedance element $Z_{NTC}$ conveniently.

To sum up, the present application provides a method and a circuit for monitoring the power supply. By using an auxiliary winding to acquire an auxiliary side voltage of a switching power supply and a voltage division circuit to acquire a divided voltage of the auxiliary side voltage and by executing multiple detection methods in the same switching period for monitoring the power supply, the problems induced by time-division detection for the OTP and the OVP according to the prior art can be solved effectively.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:

1. A method for monitoring power supply, comprising:
    sensing a winding voltage of a switching power supply using an auxiliary winding for acquiring an auxiliary side voltage;
    acquiring a divided voltage of said auxiliary side voltage using a voltage division circuit, said voltage division circuit including a first impedance element and a second impedance element, and said second impedance element including a thermistor,
    using a first detection circuit to detect said divided voltage and generate a first detection signal in a switching period of said switching power supply; and
    using a second detection circuit coupled between said first impedance element and said second impedance element to form a detection current flowing to said second detection circuit and generating a second detection signal in said switching period;
    wherein said first detection circuit and said second detection circuit operate respectively when the secondary winding of said switching power supply is discharging in said switching period and said first detection signal and said second detection signal correspond to an ambient temperature and an output voltage of said switching power supply respectively.

2. The method for monitoring power supply of claim 1, wherein said first detection circuit detects said ambient temperature according to said divided voltage and a temperature reference signal; and said second detection circuit detects said output voltage according to said detection current and an output-voltage reference signal.

3. The method for monitoring power supply of claim 2, wherein an input impedance of said second detection circuit is smaller than the impedance of said second impedance element so that said output voltage corresponds to the product of said detection current and said input impedance.

4. The method for monitoring power supply of claim 2, wherein said ambient temperature corresponds to the impedance ratio of said first impedance element to said second impedance element.

5. The method for monitoring power supply of claim 1, further comprising using a control unit to control said switching power supply to execute the over-temperature protection according to said first detection signal; and using said control unit to control said switching power supply to execute the over-voltage protection according to said second detection signal.

6. The method for monitoring power supply of claim 1, further comprising:
using a third detection circuit to detect a reverse current flowing to said voltage division circuit and generate a third detection signal in said switching period;
wherein said third detection circuit operates when a primary winding of said switching power supply is charging in said switching period; and said third detection signal corresponds to an input voltage of said switching power supply.

7. The method for monitoring power supply of claim 6, wherein said third detection circuit detects said input voltage according to said reverse current and an input-voltage reference signal.

8. The method for monitoring power supply of claim 6, wherein said third detection circuit does not allow said reverse current to flow unless said divided voltage is negative.

9. The method for monitoring power supply of claim 6, further comprising using a control unit to control said switching power supply to execute the over-temperature protection according to said first detection signal; using said control unit to control said switching power supply to execute the over-voltage protection according to said second detection signal; and using said control unit to control said switching power supply to execute the brown-out protection or the minimum startup voltage setting according to said third detection signal.

10. A circuit for monitoring power supply, applied for a switching power supply, said switching power supply including an auxiliary winding for sensing a winding voltage and acquiring an auxiliary side voltage, and comprising:
a voltage division circuit, coupled to said auxiliary winding, including a first impedance element and a second impedance element, and said second impedance element including a thermistor;
a first detection circuit, coupled between said first impedance element and said second impedance element; and
a second detection circuit, including a switch coupled between said first impedance element and said second impedance element;
wherein a switching period of said switching power supply and when the secondary winding of said switching power supply is discharging, said switch of said second detection circuit is opened or closed, respectively;
when said switch is opened, said first detection circuit detects a divided voltage of said auxiliary side voltage and generates a first detection signal in said switching period of said switching power supply;
when said switch is closed, said second detection circuit is coupled to said voltage division circuit to form a detection current flowing to said second detection circuit and said second detection circuit detects said detection current for generating a second detection signal in said switching period of said switching power supply; and said first detection signal and said second detection signal correspond to an ambient temperature and an output voltage of said switching power supply respectively.

11. The circuit for monitoring power supply of claim 10, wherein said first detection circuit includes a voltage comparison circuit for detecting said ambient temperature according to said divided voltage and a temperature reference signal.

12. The circuit for monitoring power supply of claim 11, wherein said ambient temperature corresponds to the impedance ratio of said first impedance element to said second impedance element.

13. The circuit for monitoring power supply of claim 10, wherein said second detection circuit includes a current comparison circuit for detecting said output voltage according to said detection current and an output-voltage reference signal.

14. The circuit for monitoring power supply of claim 13, wherein an input impedance of said second detection circuit is smaller than the impedance of said second impedance element so that said output voltage corresponds to the product of said detection current and said input impedance.

15. The circuit for monitoring power supply of claim 10, further comprising a control unit, coupled to said first detection circuit and said second detection circuit, controlling said switching power supply to execute the over-temperature protection according to said first detection signal, and controlling said switching power supply to execute the over-voltage protection according to said second detection signal.

16. The circuit for monitoring power supply of claim 10, further comprising:
a third detection circuit, coupled between said first impedance element and said second impedance element;
wherein in said switching period and when the primary winding of said switching power supply is charging, said third detection circuit supplies a reverse current flowing from said third detection circuit to said voltage division circuit for detecting said reverse current and generating a third detection signal corresponding to an input voltage of said switching power supply.

17. The circuit for monitoring power supply of claim 16, wherein said third detection circuit includes a current comparison circuit for detecting said output voltage according to said reverse current and an input-voltage reference signal.

18. The method for monitoring power supply of claim 16, wherein said third detection circuit does not allow said reverse current to flow unless said divided voltage is negative.

19. The circuit for monitoring power supply of claim 16, further comprising a control unit, coupled to said first detection circuit and said second detection circuit, controlling said switching power supply to execute the over-temperature protection according to said first detection signal, controlling said switching power supply to execute the over-voltage protection according to said second detection signal, and controlling said switching power supply to execute the brown-out protection or the minimum startup voltage setting according to said third detection signal.

* * * * *